United States Patent [19]
Schwalke et al.

[11] Patent Number: 5,602,410
[45] Date of Patent: Feb. 11, 1997

[54] OFF-STATE GATE-OXIDE FIELD REDUCTION IN CMOS

[75] Inventors: Udo Schwalke, Heldenstein, Germany; Wilfried Hansch, South Burlington, Vt.

[73] Assignee: Siemens Aktiengesellschaft, Munich, Germany

[21] Appl. No.: 519,669

[22] Filed: Aug. 25, 1995

[51] Int. Cl.⁶ .......................... H01L 29/76; H01L 29/94; H01L 31/062; H01L 31/113
[52] U.S. Cl. .............. 257/401; 257/69; 257/195; 257/204; 257/288; 257/368; 257/356; 257/357
[58] Field of Search .............. 257/69, 195, 204, 257/206, 213, 288, 338, 350, 351, 357, 356, 368

[56] References Cited

U.S. PATENT DOCUMENTS

| | | | |
|---|---|---|---|
| 3,855,610 | 12/1974 | Masuda et al. | 357/23 |
| 4,047,215 | 9/1977 | Frye et al. | 357/24 |
| 4,124,933 | 11/1978 | Nicholas | 29/578 |
| 4,454,524 | 6/1984 | Spence | 357/23 |
| 4,590,506 | 5/1986 | Easer | 357/24 |
| 4,935,802 | 6/1990 | Nogachi et al. | 29/78 |
| 4,992,840 | 2/1991 | Haddad et al. | 29/78 |
| 5,031,088 | 7/1991 | Yoshida | 357/23.3 |

*Primary Examiner*—Carl Whitehead, Jr.
*Attorney, Agent, or Firm*—Donald B. Paschburg

[57] ABSTRACT

A MOSFET device utilizes the gate depletion effect to reduce the oxide field over the junction area. Since the gate depletion effect is present in the non-conducting off state for $n^+$ gate PMOS devices and $p^+$ gate NMOS devices, performance degradation is overcome. The level of doping of the gate is critical. In order to prevent gate depletion in the conducting, on state, the NMOS FET must use a highly doped $n^+$ gate. The PMOS FET $n^+$ gate must be non-degeneratively doped in order to utilize the advantage of the gate depletion in the non-conducting, off state. This is accomplished by implanting different doses of the same dopant type into the different gates. The MOSFET device can be implemented equally well for $n^+$ gate PMOS FET devices as well as for $p^+$ gate NMOS FET devices.

8 Claims, 4 Drawing Sheets

OFF-STATE GATE-OXIDE FIELD REDUCTION IN CMOS

FIELD OF THE INVENTION

The present invention relates to a semiconductor device and more particularly to a metal-oxide-semiconductor field-effect-transistor having improved device reliability.

BACKGROUND OF THE INVENTION

A typical CMOS circuit application can provide very low standby power. Current flows in the circuit only when a transition of state is occurring. This feature makes it extremely easy to manage the power dissipation in CMOS designs. For an n-channel MOS device the current carriers are electrons, whereas for a p-channel MOS device the carriers are holes. Four separate regions or terminals exist in a MOS transistor: source, drain, gate, and substrate. For normal operation, the source, drain, and gate voltages measured with respect to substrate are positive for an n-channel device and negative for a p-channel device. The output is always connected to one of the power supply rails because at any given state only one transistor is on and the other is off. This guarantees that the logic swing will be determined by the power supply voltage only, and not by the ratio of the effective impedance of the devices, as is the case with static nMOS design.

In semiconductor technology, polycrystalline silicon (polysilicon) is very frequently used as a gate electrode. The popularity of polysilicon is largely due to the fact that polysilicon is a particularly suitable material in self-registering MOS processes, in which the gate electrode and source/drain areas are defined by the same masking step. In integrated circuits, polysilicon is used for circuit wiring as well as a gate electrode.

In the realization of submicron MOSFETs decreasing gate oxide thickness ($T_{ox}$), the correspondingly increasing electric field across the thin dielectric is a major concern. With gate oxide thickness of 10 nm and smaller, the supply voltage had to be reduced from 5 V to 3.3 V in order to reduce the electric field across the dielectric to a safe level of below 4 MV/cm. However, with decreasing supply voltage, the field enhancement caused by the workfunction difference between the n$^+$ gates and p$^+$ junctions, or the p$^+$ gates and n$^+$ junctions, becomes increasingly important. The workfunction difference of 1.1 eV remains constant with decreasing supply voltage. The oxide field ($E_{ox}$) can be calculated by utilizing the formula shown in Equation 1 where $V_{gate}$ represents the gate voltage, $V_{fb}$ represents the flatband voltage, and $T_{ox}$ represents the oxide thickness.

$$E_{ox} = [(\pm V_{gate}) + (\pm V_{fb})]/T_{ox}$$

Equation 1.

The flatband voltage ($V_{fb}$) can be calculated by utilizing the formula shown in Equation 2 where $\phi_{ms}$ represents the workfunction difference, $Q_{ox}$ represents the oxide charge and $C_{ox}$ the oxide capacitance.

$$V_{fb} = \phi_{ms} + Q_{ox}/C_{ox}$$

Equation 2.

Depending upon the bias of the gate and source, the workfunction difference ($\phi_{ms}$) will increase or decrease the electric field in the gate/junction region as evident from Equation 1. FIG. 1 illustrates the gate-to-junction area of a MOSFET 10, having an n$^+$ gate 12, n$^-$ substrate 14 and p$^+$ junction 16 with a gate oxide thickness ($T_{ox}$) 18. The oxide field 20 is affected by the workfunction difference ($\phi_{ms}$) according to Equation 1.

Referring to FIG. 2, there is shown, the effect of the gate polarity on oxide field between source and drain of n$^+$ PMOS devices and p$^+$ PMOS devices which are in a conducting state, turned on. FIG. 3. shows the simulated oxide field along the channel for n$^+$ PMOS and p$^+$ PMOS devices which are in a non-conducting state, turned off. The field enhancement of approximately 1 MV/cm for n$^+$PMOS FETs is due to the added workfunction difference. The results shown in FIGS. 2 and 3 were obtained with two dimensional computer simulations utilizing MINIMOS. In the non-conducting off state the oxide field is increased by the workfunction difference up to 4.6 MV/cm at the drain side for the n$^+$ gate PMOS when a nominal oxide thickness of 10 nm is assumed. When a process variation of 10% in $T_{ox}$ is accounted for, a maximum oxide field of 5 MV/cm will result. This enhanced oxide field will increase the risk of device failures such as oxide breakdowns and device instabilities.

MOSFETs having equal gate and junction dopant type, i.e. p$^+$ gate PMOS and n$^+$ gate NMOS, have been proposed in order to avoid the high oxide fields which were described above. Referring to FIGS. 2 and 3, it can be seen that the oxide field of the p$^+$ gate PMOS device remains below 3.6 MV/cm. However, the actual implementation of such a symmetrical device design in CMOS technology complicates the process substantially. This is because a dual workfunction gate technology is required. Information on the feasibility of fabricating dual gate CMOS devices can be obtained by referring to an article entitled "Doping of n+ and p+ Polysilicon in a Dual-Gate CMOS Process" by C. Y. Wong et al published by IEEE in IEDM Tech. Dig. 238 (1988). A polysilicon depletion occurs at reverse biases, which causes device current degradation. This effect becomes more severe as the gate oxide thickness ($T_{ox}$) becomes smaller. Reference is made to an article entitled "Effects of Depleted Poly-Si Gate on MOSFET Performance" by M. Iwase et al published in Ext. Abstract SSDM 271 (1990) for information on dual gate symmetric CMOS structures for sub-micron integration and degradation of performance by the depleted gate on the device.

Therefore, reducing the workfunction related high oxide fields for single workfunction gate technologies, such as for n$^+$ gate only and p$^+$ gate only, for CMOS is highly desirable. One solution is through the controlled formation of gate birds beaks which have the tendency to increase the oxide thickness at the gate edges. This solution, however leads to a transconductance degradation which results in a loss of performance.

It is an object of the present invention to reduce the oxide field over the junction area.

SUMMARY OF THE INVENTION

The present invention is a MOSFET device which utilizes the gate depletion effect to reduce the oxide field over the junction area. Since the gate depletion effect is present in the non-conducting off state for n$^+$ gate PMOS devices and p$^+$ gate NMOS devices, performance degradation is overcome. The level of doping of the gate is critical. In order to prevent gate depletion in the conducting, on state, the NMOS FET must use a highly doped n$^+$ gate. The PMOS FET n$^+$ gate must be non-degeneratively doped in order to utilize the advantage of the gate depletion in the non-conducting, off state. This is accomplished by implanting different doses of the same dopant type into the different gates. The MOSFET device can be implemented equally well for $n^+$ gate PMOS devices as well as for $p^+$ gate NMOS devices.

BRIEF DESCRIPTION OF THE FIGURES

The above objects and further features and advantages of the invention are described in detail below in conjunction with the drawing, of which.

DETAILED DESCRIPTION OF THE INVENTION

While the present invention is described in the context of a conventional $n^+$ doped gate PMOS FET, it is equally well suited for a $p^+$ gate NMOS FET. The present invention can be utilized with both buried as well as surface channel devices. Although the present invention is especially well suited for use with "single workfunction" CMOS gate technologies can also be utilized with "dual workfunction" CMOS gate technologies.

The present invention utilizes the gate depletion effect to reduce the oxide field over the junction area. Since the gate depletion effect is present only in the non-conducting off state for $n^+$ gate PMOS devices and $p^+$ gate NMOS devices, the performance degradation is overcome.

Figure 4:
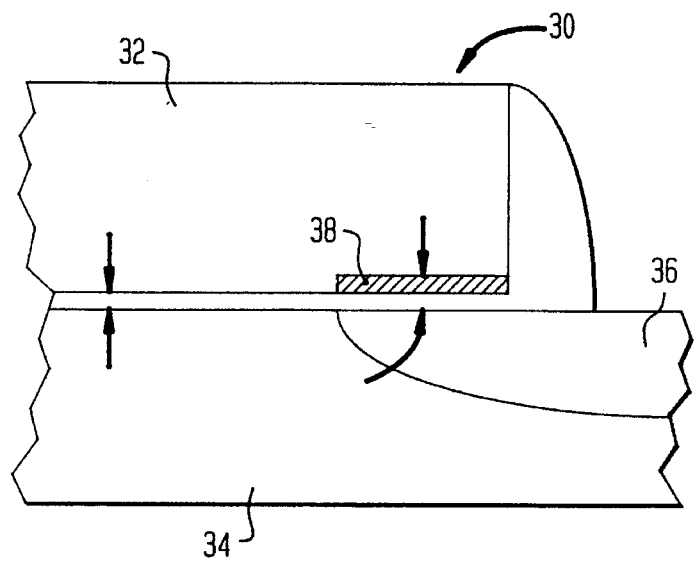
FIG. 4 shows the basic principle of the present invention.

FIG. 4 illustrates the basic principle of the present invention. Shown is the gate-to-junction area of a MOSFET device 30, having an $n^+$ gate 32, $n^-$ substrate 34, $p^+$ junction 36 and a depleted region 38 with a gate oxide thickness ($T_{OX}$) 40. For a non-degenerately doped poly-Si gate a depleted region 38 with a thickness $W_{poly}$ is formed over the junction in the gate when the MOSFET device 30 is in the non-conducting, off state. The potential drop in the depleted region 38 reduces the oxide field ($E_{OX}$).

Figure 5:
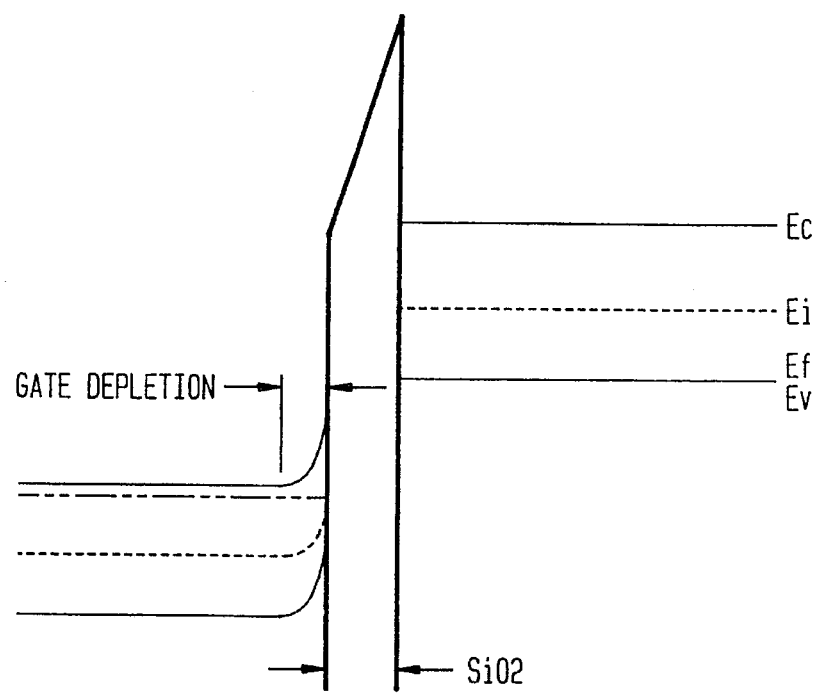
FIG. 5 shows a band diagram for the present invention.

Referring to FIGS. 4 and 5, it can be seen that the potential drop across the gate depletion width will lower the field across the oxide. Simulation shows that for an active carrier concentration in the gate of $10^{19}cm^3$ the oxide field in the $p^+$ region is reduced by 0.6 MV/cm.

Figure 1:
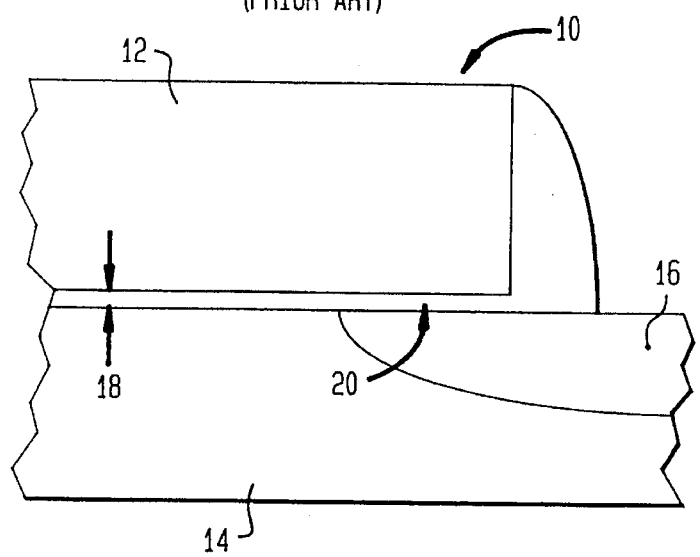
FIG. 1 shows the gate-to-junction area of a MOSFET device.
Figure 2:
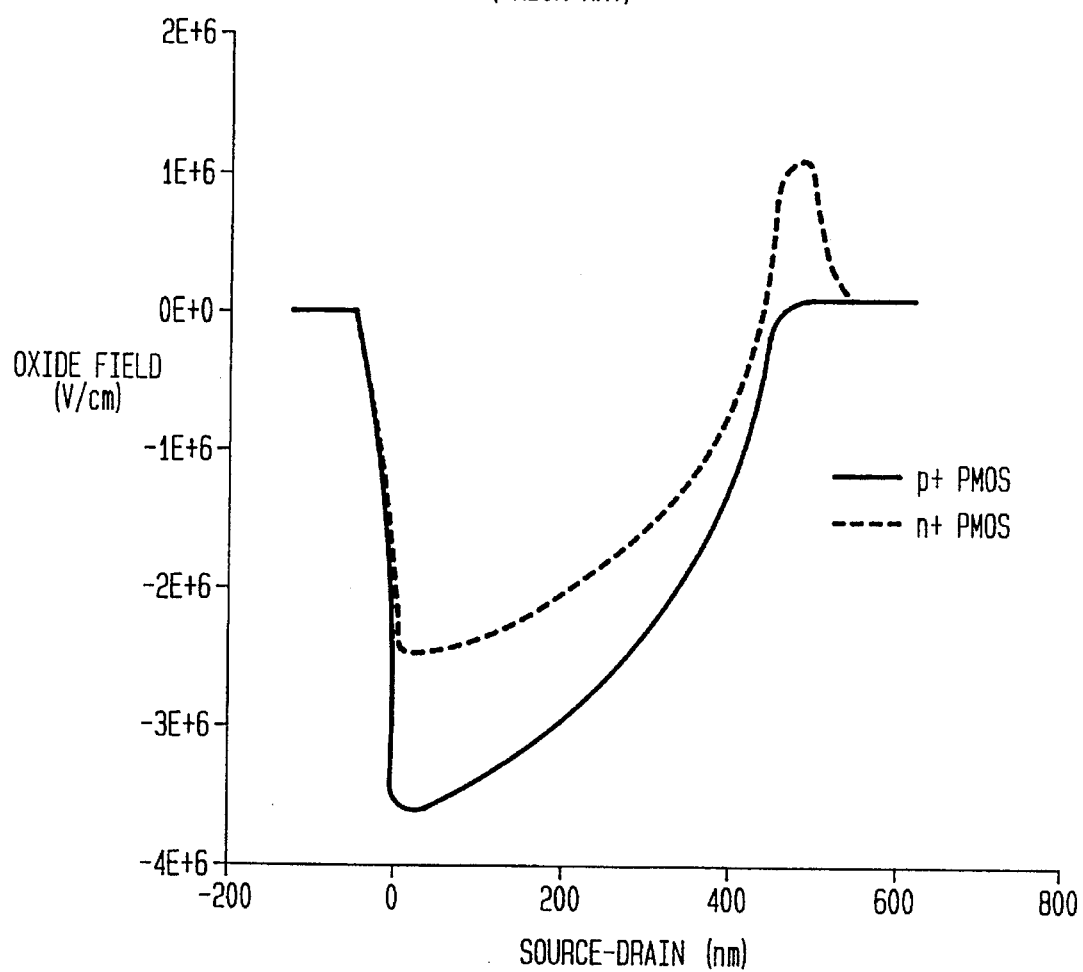
FIG. 2 shows the effect of gate polarity on the oxide field.
Figure 3:
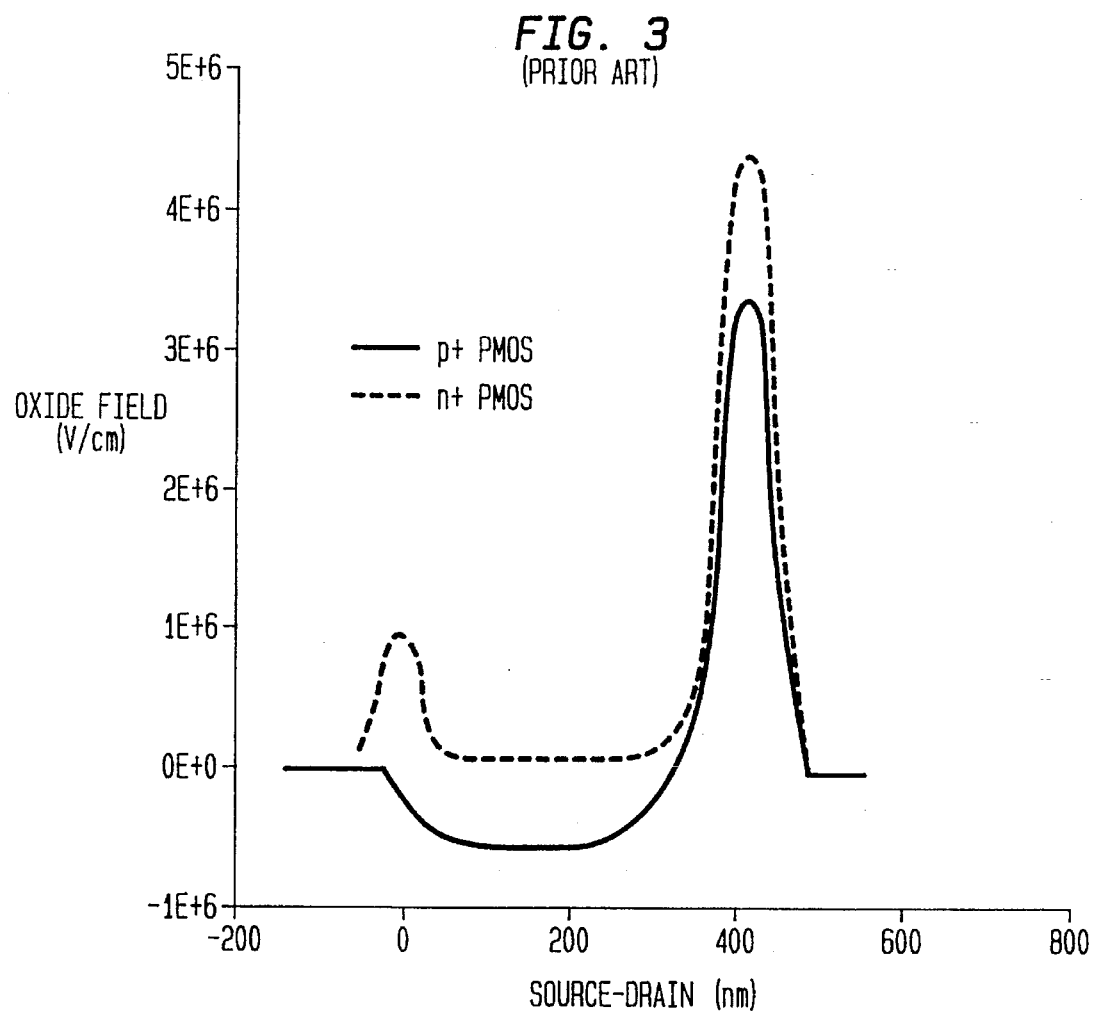
FIG. 3 shows oxide field for $n^+$ and $p^+$ PMOS FETs.

When the PMOS device is in the conducting, on state, the gate is driven into accumulation. Therefore, when the device is in the conducting, on state, no gate depletion effect occurs and there is no corresponding performance degradation. Furthermore, the workfunction difference ($\phi_{ms}$) is beneficial, as it has an opposite sign which reduces the oxide field in comparison to the $p^+$ gate PMOS shown in FIG. 2.

In the embodiment of the present invention in a CMOS FET device, the level of doping of the gate is critical, which will now be explained. In order to prevent gate depletion in the conducting, on state, the NMOS FET must use a highly doped $n^+$ gate. The PMOS FET $n^+$ gate must be non-degeneratively doped in order to utilize the advantage of the gate depletion in the non-conducting, off state. This is accomplished by implanting different doses of the same dopant type into the different gates. This will result in the necessity of an extra mask.

In order to avoid an extra mask, the CMOS fabrication process is modified. After n-wells, p-wells, field oxide and gate oxide is grown, gate polysilicon and a cap oxide layer is deposited. The polysilicon is non-degenerately n-doped, e.g. $1E18$ Phos/cm$^3$.

Figure 6:
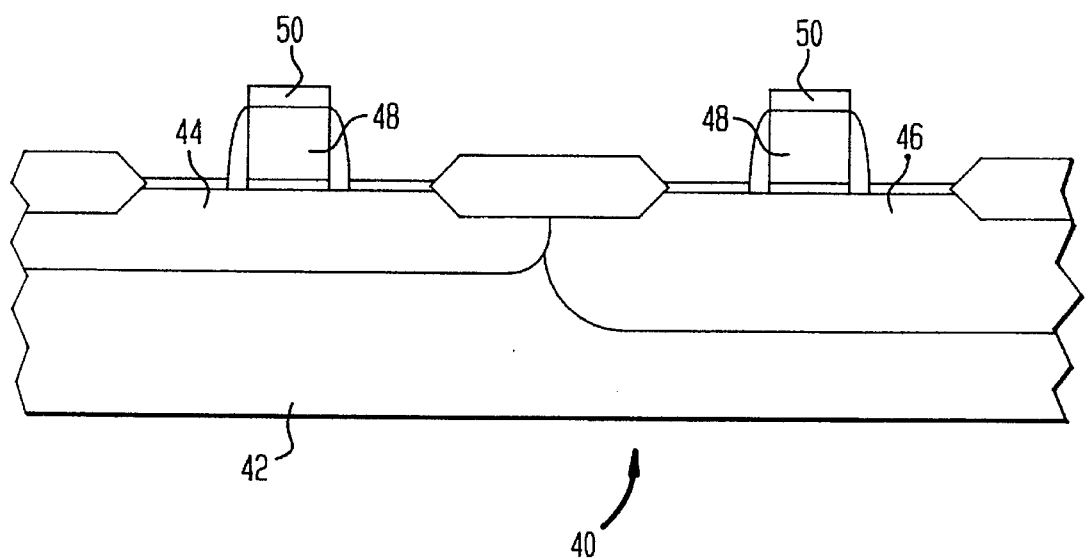
FIG. 6 shows the gate stacks.

Referring to FIG. 6, there is illustrated a MOSFET 40, having a substrate 42, with a p-well region 44 and an n-well region 46, n doped regions 48, and cap layers 50 which define the MOSFET gate stacks.

Figure 7:
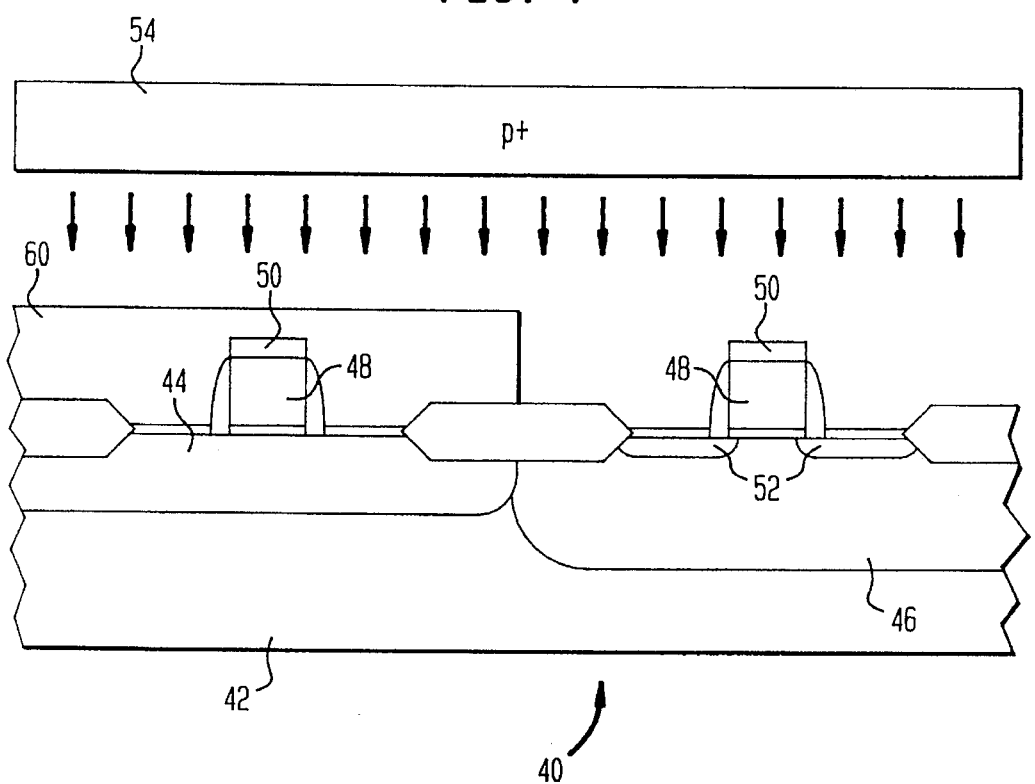
FIG. 7 shows the cap layer protection during p+ implantation.

Referring to FIG. 7, there is shown a first mask 60 which is suitably aligned. It can also be seen that the cap layer 50 protects the gate polysilicon against implantation from the p+ implant source 54 which defines the $p^+$ source/drain regions 52. The non-degenerately n doped polysilicon remains for the PMOS FET.

Figure 8:
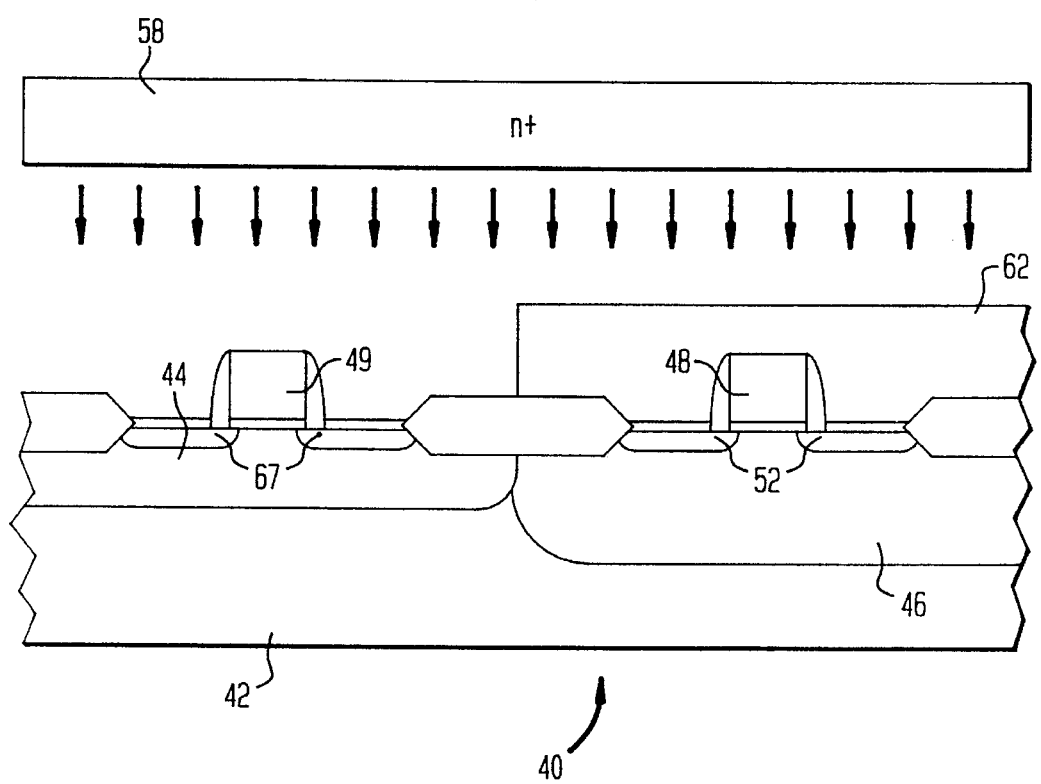
FIG. 8 shows the cap layer protection during n+ implantation.

Referring to FIG. 8, there is shown a second mask 62 which is suitably aligned. For the NMOS FET, after removal of the cap layer, the n doped polysilicon is converted into degenerately doped n+ polysilicon 49 by means of the implantation from the n+ implant source 58 which defines the $n^+$ source/drain junctions 61.

Sources for implanting p+ and n+ impurities include boron and arsenic ion implantation. Other sources for implanting impurities are well known to those ordinarily skilled in the art. In order to provide good electrical contact to the high resistive gate and to minimize gate delay, the gate is electrically shunted by enhancing the conductivity, therefore lowering gate resistivity, of the gate surface. This can be done by means of e.g. gate silicidation (i.e. Ti-SALICIDE process) or selective metal, deposition (e.g. CVD-tungsten).

The fabrication process is then completed. The remaining steps involve inter metal-dielectric, contact holes, metalization and other steps that are well known to those ordinarily skilled in the art.

It should be understood that the embodiments described herein are merely exemplary and that a person skilled in the art may make variations and modifications without departing from the spirit and scope of the invention. All such variations and modifications are intended to be included within the scope of the invention as defined in the appended claims.

What is claimed is:

1. An improved submicron MOSFET semiconductor device comprising:

a semiconductor body having a top surface;

a comparatively thin dielectric layer on said top surface forming a gate dielectric element;

a gate electrode of doped semiconductor material on said thin dielectric layer wherein a surface potential on said semiconductor body is responsive to said gate electrode;

means for electrically isolating said gate electrode from said semiconductor body, said means comprising a high-resistivity part of said gate electrode adjoining said gate dielectric, said high-resistivity part having a sufficient doping concentration and a conductivity type wherein during the operation of the device a depletion layer is formed extending from the gate dielectric into the high-resistivity part of said gate electrode.

2. The device as recited in claim 1, wherein said comparatively thin dielectric layer is less than 10 nm.

3. The device as recited in claim 1, wherein said gate electrode comprises an $n^+$ non-degenerately doped gate.

4. The device as recited in claim 1, wherein said gate electrode comprises a $p^+$ non-degenerately doped gate.

5. The device as recited in claim 1, wherein said doping concentration is sufficient to reduce an oxide field in a $p^+$ region while being non-degenerative in an $n^+$ region.

6. An submicron MOSFET semiconductor device comprising:

a semiconductor body having a top surface;

a dielectric layer less than 10 nm thick on said top surface forming a gate dielectric element;

a gate electrode of doped semiconductor material on said thin dielectric layer wherein a surface potential on said semiconductor body is responsive to said gate electrode;

means for electrically isolating said gate electrode from said semiconductor body, said means comprising a high-resistivity part of said gate electrode adjoining said gate dielectric, said high-resistivity part having a sufficient doping concentration and a conductivity type wherein during the operation of the device a depletion layer is formed extending from the gate dielectric into the high-resistivity part of said gate electrode; wherein said doping concentration is sufficient to reduce an oxide field in a $p^+$ region while being non-degenerative in an $n^+$ region.

7. The device as recited in claim 6, wherein said gate electrode comprises an $n^+$ non-degenerately doped gate.

8. The device as recited in claim 6, wherein said gate electrode comprises a $p^+$ non-degenerately doped gate.

* * * * *